United States Patent
Lim et al.

(10) Patent No.: US 7,612,624 B2
(45) Date of Patent: Nov. 3, 2009

(54) RESISTOR-CAPACITOR OSCILLATION CIRCUIT CAPABLE OF ADJUSTING OSCILLATION FREQUENCY AND METHOD OF THE SAME

(75) Inventors: Joon Hyung Lim, Gyunggi-Do (KR); Tah Joon Park, Gyunggi-Do (KR); Kwang Mook Lee, Seoul (KR); Koon Shik Cho, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 72 days.

(21) Appl. No.: 11/928,720

(22) Filed: Oct. 30, 2007

(65) Prior Publication Data

US 2008/0100391 A1    May 1, 2008

(30) Foreign Application Priority Data

Oct. 31, 2006    (KR) .................. 10-2006-0106934

(51) Int. Cl.
*H03K 3/02*    (2006.01)

(52) U.S. Cl. .................. 331/143; 331/34; 331/36 C; 331/179

(58) Field of Classification Search .................. 331/34, 331/36 C, 25, 111, 143, 177 R, 177 V; 327/156, 327/157

See application file for complete search history.

(56) References Cited

U.S. PATENT DOCUMENTS

| | | | | |
|---|---|---|---|---|
| 5,180,991 A | * | 1/1993 | Takashima | 331/1 A |
| 5,543,754 A | * | 8/1996 | Onodera | 331/25 |
| 5,702,426 A | * | 12/1997 | Pons et al. | 607/27 |
| 6,882,235 B2 | * | 4/2005 | Kappes et al. | 331/135 |
| 2008/0150646 A1 | * | 6/2008 | Chen | 331/143 |

FOREIGN PATENT DOCUMENTS

JP         2001285056 A    * 10/2001

* cited by examiner

*Primary Examiner*—Robert Pascal
*Assistant Examiner*—Ryan J. Johnson
(74) *Attorney, Agent, or Firm*—Lowe Hauptman Ham & Berner, LLP

(57) ABSTRACT

An RC oscillation circuit and method capable of adjusting an oscillation frequency includes: an RC oscillator including a variable resistor and a variable capacitor, the RC oscillator generating an RC oscillating signal having a frequency determined by a resistance of the variable resistor and a capacitance of the variable capacitor; a counter counting a clock number of a reference oscillating signal corresponding to one period of the RC oscillating signal to generate a first count value, the reference oscillating signal having a preset frequency; and a frequency controller controlling a frequency of the RC oscillating signal by determining the resistance of the variable resistor and the capacitance of the variable capacitor such that a difference between the first count value and a preset second count value is smaller than a preset first critical value.

8 Claims, 5 Drawing Sheets

RESISTOR-CAPACITOR OSCILLATION CIRCUIT CAPABLE OF ADJUSTING OSCILLATION FREQUENCY AND METHOD OF THE SAME

CROSS-REFERENCE TO RELATED APPLICATIONS

This application claims the priority of Korean Patent Application No. 2006-106934 filed on Oct. 31, 2006, in the Korean Intellectual Property Office, the disclosure of which is incorporated herein by reference.

BACKGROUND OF THE INVENTION

1. Field of the Invention

The present invention relates to a resistor-capacitor (RC) oscillation circuit capable of adjusting an oscillation frequency and an oscillation method thereof, and more particularly, to an RC oscillation circuit capable of adjusting an oscillation frequency in which a resistance of a variable resistor and a capacitance of a variable capacitor are determined to control an oscillation frequency promptly and accurately despite changes in operating environment such as temperature, and an oscillation method thereof.

2. Description of the Related Art

In 2000, the Institute of Electrical and Electronics Engineers (IEEE) launched a move to standardize a low-speed wireless private network application into IEEE 802.15.4. This standardized version requires a battery to run for at least 5 to 7 years, which thus necessitates designing of a circuit consuming minimal power. The most widely known technology for minimizing power consumption is to turn off a circuit when it does not need to be in operation.

Meanwhile, in a system where a power is turned off during deactivation for less power consumption, the power should be turned on and off through a shorter time to reduce power consumption of the system. Especially, this characteristic is notably important in an oscillator circuit for generating a reference frequency which is essentially used in a telecommunication system.

In general, a conventional crystal oscillator needs time for self-start to amplify noises generated internally to an operational level. Accordingly, the conventional crystal oscillator entails a long operation time and significant power consumption to start oscillating. In consequence, the crystal oscillator with such operation time and power consumption is ill-suitable for a system which has a power turned off during deactivation to minimize power consumption.

To overcome problems with the conventional crystal oscillator, a resistor-capacitor (RC) oscillator has been suggested. The RC oscillator is inexpensive, low in power consumption, short in starting time and easily controllable in a frequency. Also, the RC oscillator may be included in a system-on-a-chip so that a telecommunication system may be implemented as one chip.

FIG. 1 is a block diagram illustrating a configuration of a conventional RC oscillation circuit. As shown in FIG. 1, the conventional RC oscillation circuit includes a phase frequency detector (PFD) 11, a low pass filter (LPF) 12, a voltage holder (VH) 13 and a voltage control oscillator, i.e., an RC oscillator 14.

In a brief description of the conventional RC oscillator, the PFD 11 receives a TXCO clock from a temperature compensator Xtal Oscillator TXCO and an output clock from the voltage control oscillator 14, compares the TCXO clock with the output clock from the voltage control oscillator 14, and outputs a frequency and a phase difference to the low pass filter 12.

The LPF 12 converts a signal outputted from the PFD 11 into a voltage.

The VH 13 maintains a current output voltage when a hold signal is fed from the outside and outputs the voltage from the LPF 12 to the VCO 14 when a pass signal is fed from the outside.

The VCO 14 is configured as the RC oscillator and has an oscillation frequency changed according to an input voltage.

The conventional RC oscillation circuit requires the voltage control oscillator, and may have an oscillation circuit degraded in stability due to a feed back loop formed, and may experience increase in time for adjusting the oscillation frequency.

SUMMARY OF THE INVENTION

An aspect of the present invention provides a resistor-capacitor (RC) oscillation circuit capable of adjusting an oscillation frequency in which a resistance of a variable resistor and a capacitance of a variable capacitor are determined to adjust an oscillation frequency promptly and accurately despite changes in operating environment such as temperature, and an oscillation method thereof.

According to an aspect of the present invention, there is provided a resistor-circuit oscillation circuit capable of adjusting an oscillation frequency, the resistor-circuit oscillation circuit including: a resistor-circuit oscillator including a variable resistor and a variable capacitor, the resistor-circuit oscillator generating a resistor-capacitor oscillating signal having a frequency determined by a resistance of the variable resistor and a capacitance of the variable capacitor; a counter counting a clock number of a reference oscillating signal corresponding to one period of the resistor-capacitor oscillating signal to generate a first count value, the reference oscillating signal having a preset frequency; and a frequency controller controlling a frequency of the resistor-capacitor oscillating signal by determining the resistance of the variable resistor and the capacitance of the variable capacitor such that a difference between the first count value and a preset second count value is smaller than a preset first critical value.

The variable resistor includes: a plurality of resistors connected in series with one another; and a plurality of first switches connected in parallel with the resistors, respectively, wherein the frequency controller controls on/off state of the first switches to determine the resistance of the variable resistor.

The variable capacitor includes: a plurality of capacitors connected in parallel with one another; and a plurality of second switches connected in series with the capacitors, respectively, wherein the frequency controller controls on/off state of the second switches to determine the capacitance of the variable capacitor.

The frequency controller determines the capacitance of the variable capacitor after determining the resistance of the variable resistor.

The frequency controller adjusts the resistance of the variable resistor when the difference between the first count value and the second count value is greater than a preset second critical value, and adjusts the capacitance of the variable capacitor when the difference between the first count value and the second count value is smaller than the second critical value and greater than the first critical value.

The frequency controller adjusts the resistance of the variable resistor by a first adjustment value when the difference between the first count value and the second count value is greater than a preset third critical value, and adjusts the resistance of the variable resistor by a second adjustment value smaller than the first adjustment value when the difference between the first count value and the second count value is smaller than the third critical value and greater than the second critical value.

The resistor-capacitor oscillation circuit may further include a crystal oscillator generating the reference oscillating signal from an oscillating signal generated from a crystal resonator.

According to another aspect of the present invention, there is provided an oscillation method of a resistor-capacitor oscillation circuit capable of adjusting an oscillation frequency, the oscillation method including: generating a resistor-capacitor oscillating signal having a frequency determined by a resistance of a variable resistor and a capacitance of a variable capacitor; counting a clock number of a reference oscillating signal corresponding to one period of the resistor-capacitor signal to generate a first count value, the reference oscillating signal having a predetermined frequency; and adjusting the resistance of the variable resistor and the capacitance of the variable capacitor such that a difference between the first count value and a second count value is smaller than a preset first critical value.

The adjusting the resistance of the variable resistor and the capacitance of the variable capacitor includes: adjusting the resistance of the variable resistor when the difference between the first count value and the second count value is greater than a preset second critical value; and adjusting the capacitance of the variable capacitor when the difference between the first count value and the second count value is smaller than the second critical value and greater than the preset first critical value.

The adjusting the resistance of the variable resistor includes: adjusting the resistance of the variable resistor by a first adjustment value when the difference between the first count value and the second count value is greater than a preset third critical value; and adjusting the resistance of the variable resistor by a second adjustment value smaller than the first adjustment value when the difference between the first count value and the second count value is smaller than the third critical value and greater than the second critical value.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
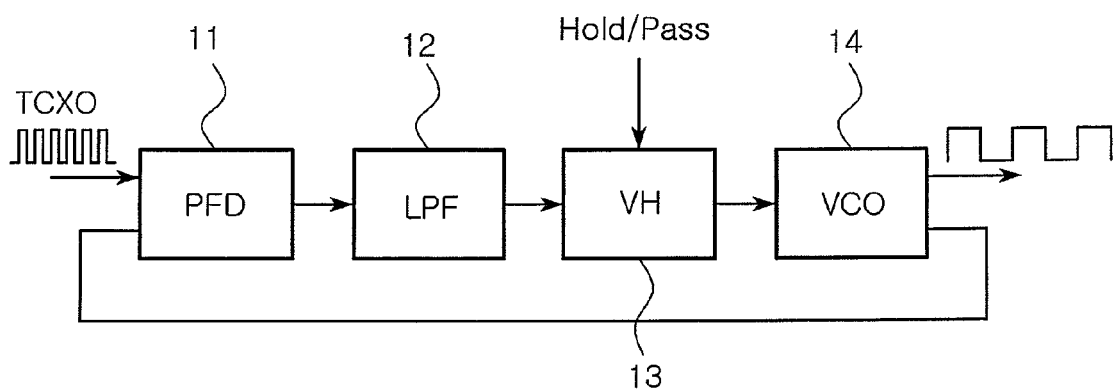
FIG. 1 is a block diagram illustrating a conventional RC oscillation circuit.
Figure 2:
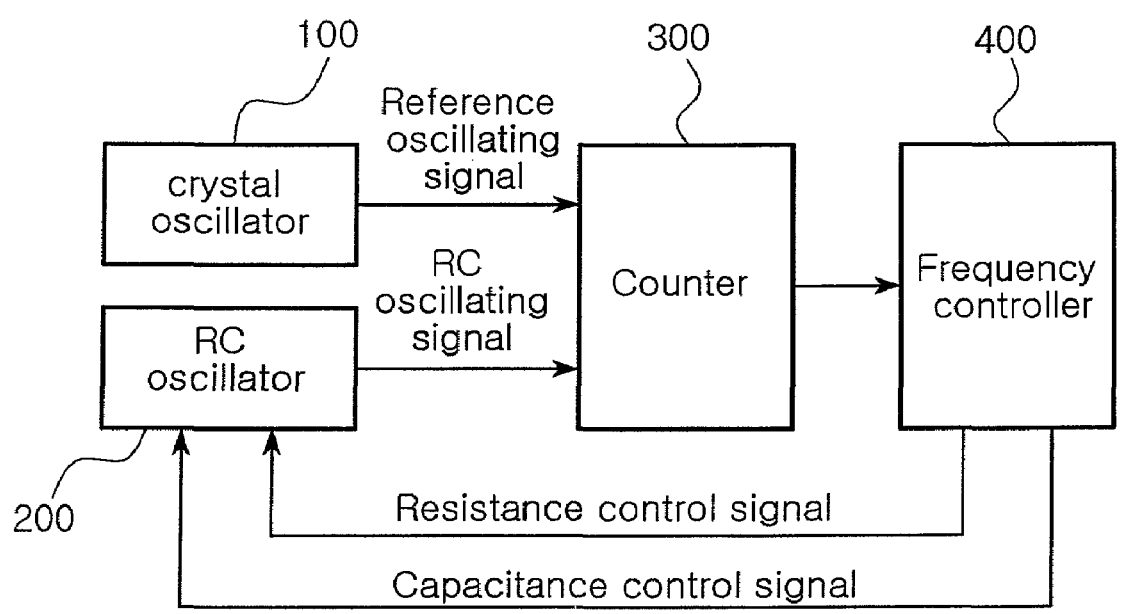
FIG. 2 is a block diagram illustrating an RC oscillation circuit capable of adjusting an oscillation frequency according to an exemplary embodiment of the invention.
Figure 3:
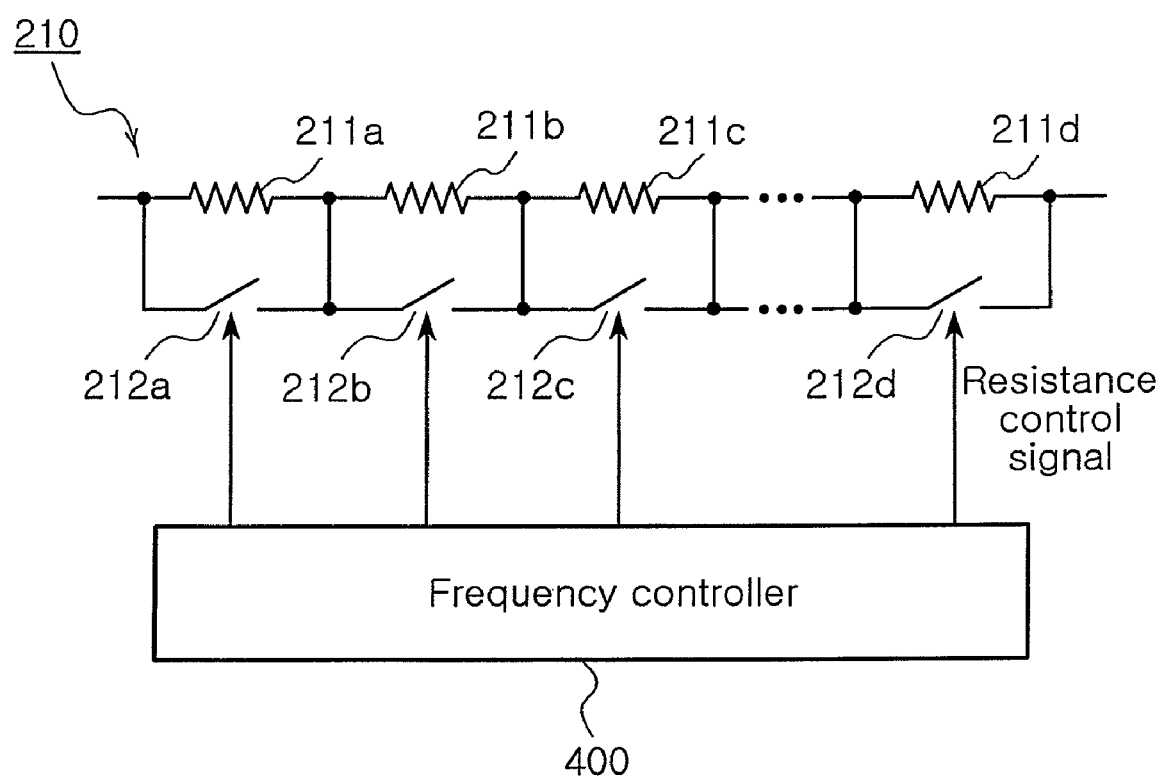
FIG. 3 is a circuit diagram illustrating an example of a variable resistor of the RC oscillation circuit shown in FIG. 2.
Figure 4:
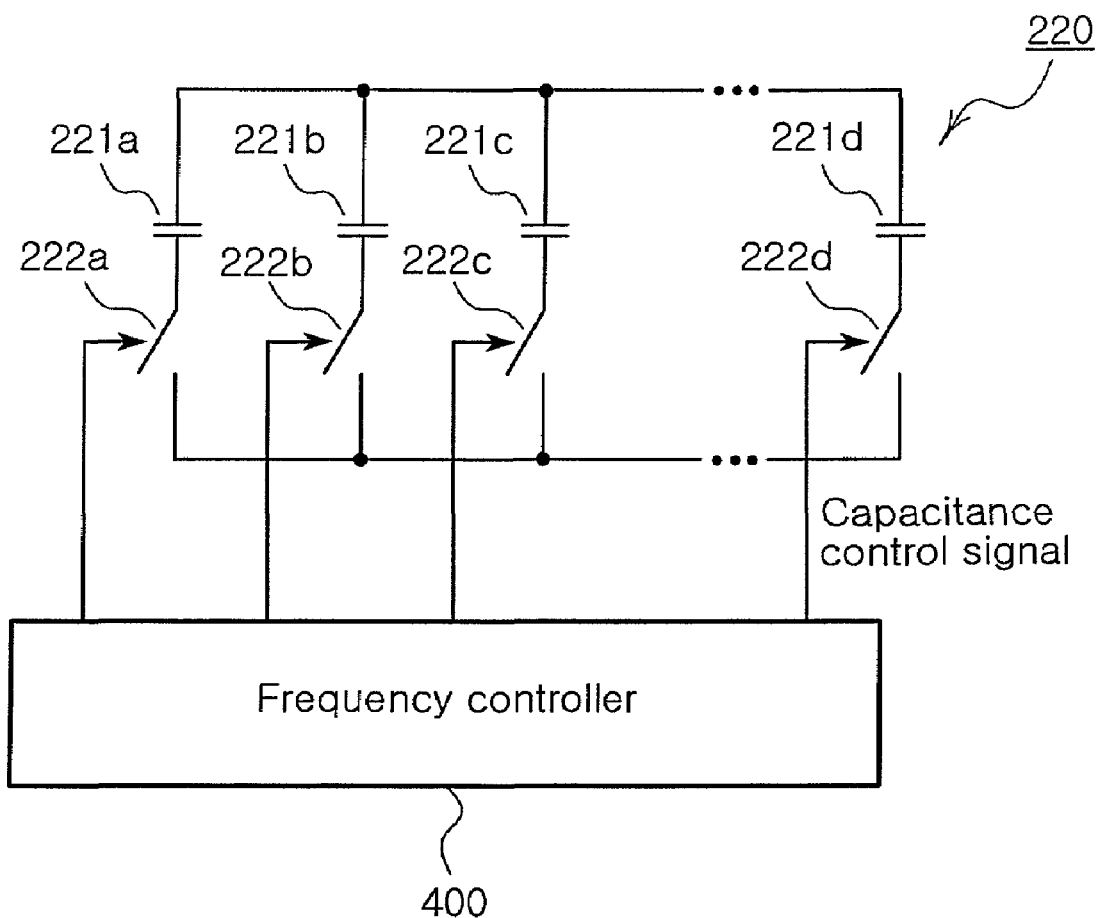
FIG. 4 is a circuit diagram illustrating an example of a variable capacitor of the RC oscillation circuit of FIG. 2.

FIG. 2 is a block diagram illustrating a resistor-capacitor (RC) oscillation circuit capable of adjusting an oscillation frequency according to an exemplary embodiment of the invention. FIG. 3 is a circuit diagram illustrating an example of a variable resistor of the RC oscillation circuit of FIG. 2. FIG. 4 is a circuit diagram illustrating an example of a variable capacitor of the RC oscillation circuit of FIG. 2.

Referring to FIGS. 2 to 4, the RC oscillation circuit of the present embodiment includes a crystal oscillator 100, an RC oscillator 200, a counter 300 and a frequency controller 400. The crystal oscillator 100 generates a reference oscillating signal from a resonance signal generated from a crystal resonator. The RC oscillator 200 includes a variable resistor 210 and a variable capacitor 220. The RC oscillator 200 generates an RC oscillating signal having a frequency determined by a resistance of the variable resistor 210 and a capacitance of the variable capacitor 220. The counter 300 counts a clock number of the reference oscillating signal corresponding to one period of the RC oscillating signal to generate a first count value. The frequency controller 400 controls a frequency of the RC oscillating signal by determining the resistance of the variable resistor 210 and the capacitance of the variable capacitor 220 such that a difference between the first count value and a preset second count value is smaller than a preset first critical value.

The variable resistor 210 includes a plurality of resistors 211a to 211d connected in series with one another, and a plurality of first switches 212a to 212d connected in parallel with the resistors 211a to 211d, respectively. The frequency controller controls on/off state of the first switches 212a to 212d to determine the resistance of the variable resistor 210.

The variable capacitor 220 includes a plurality of capacitors 221a to 221d connected in parallel with one another, and a plurality of second switches 222a to 222d connected in series with the capacitors 221a to 221d, respectively. The frequency controller 400 controls on/off state of the second switches 22a to 222d to determine the capacitance of the variable capacitor 220.

Meanwhile, the frequency controller 400 determines the capacitance of the variable capacitor 220 after determining the resistance of the variable resistor 210.

Here, the frequency controller 400 adjusts the resistance of the variable resistor 210 when the difference between the first count value and the second count value is greater than a preset second critical value, and adjusts the capacitance of the variable capacitor 220 when the difference between the first count value and the second count value is smaller than the second critical value and greater than the first critical value.

Moreover, the frequency controller 400 adjusts the resistance of the variable resistor 210 by a first adjustment value when the difference between the first count value and the second count value is greater than a preset third critical value, and adjusts the resistance of the variable resistor 210 by a second adjustment value smaller than the first adjustment value when the difference between the first count value and the second count value is smaller than the third critical value and greater than the second critical value.

Figure 5:
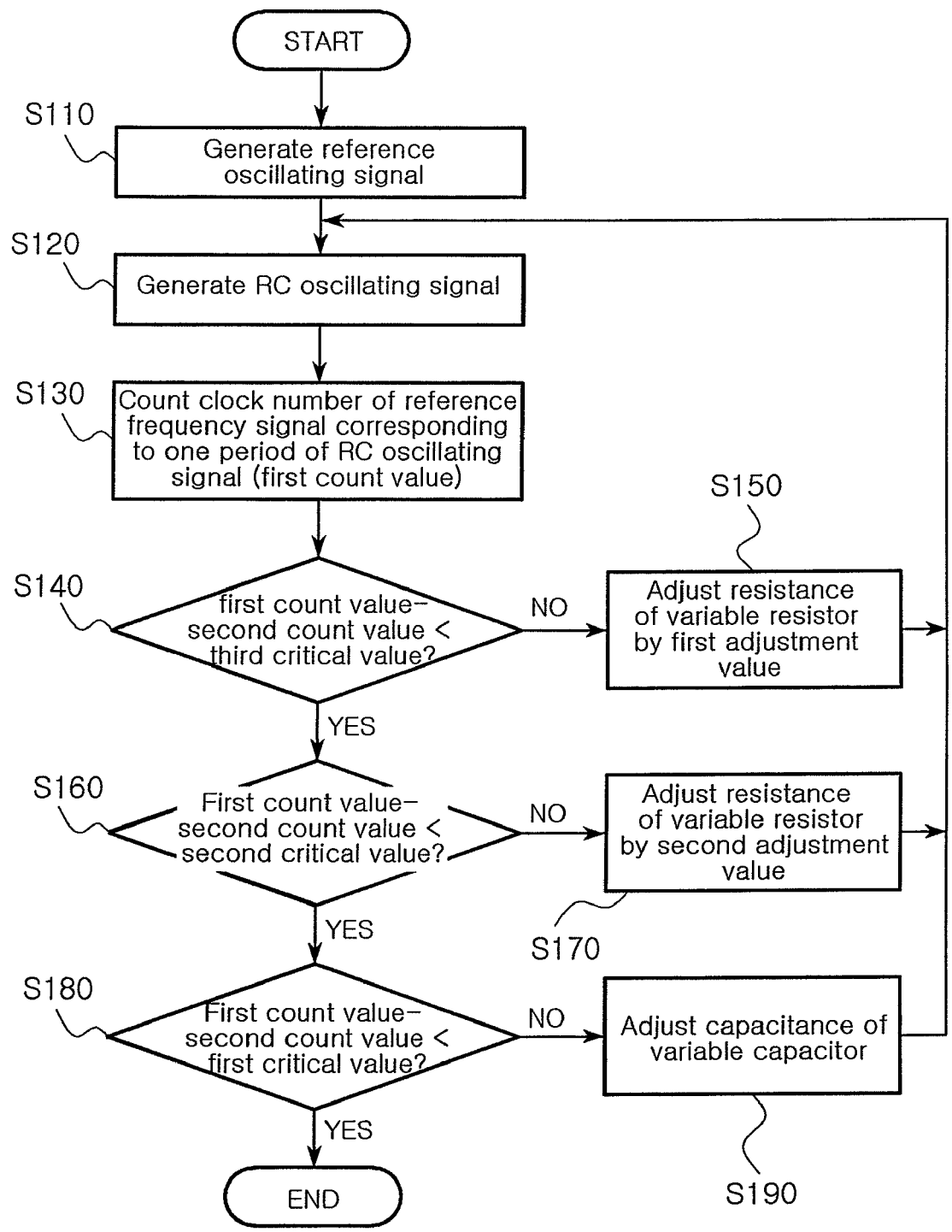
FIG. 5 is a flowchart illustrating an oscillation method of an RC oscillation circuit capable of adjusting an oscillation frequency according to an exemplary embodiment of the invention.

FIG. 5 is a flow chart illustrating an oscillation method of an RC oscillation circuit capable of adjusting an oscillation frequency according to an exemplary embodiment of the invention.

Referring to FIG. 5, the oscillation method of the RC oscillation circuit of the present embodiment starts with generating a reference oscillating signal in operation S110. Then, an RC oscillating signal is generated in operation S120. A first count value is generated by counting a clock number of the reference oscillating signal corresponding to one period of the RC oscillating signal in operation S130. Next, it is determined whether a difference between the first count value and a preset second count value is smaller than a preset third critical value in operation S140. Subsequently, a resistance of the variable resistor is adjusted by a first adjustment value when the difference between the first count value and the second count value is greater than the preset third critical value in operation S150. Thereafter, it is determined whether the difference between the first count value and the preset second count value is smaller than a preset second critical value in operation S160. The resistance of the variable resistor is adjusted by a first adjustment value when the difference between the first count value and the preset second count value is greater than the preset second critical value in operation S170. Afterwards, it is determined whether the difference between the first count value and the preset second count value is smaller than a preset first critical value in operation S180. A capacitance of the variable capacitor is adjusted when the difference between the first count value and the preset second count value is greater than the preset first critical value in operation S180.

Hereinafter, operation and effects of the present invention will be explained with reference to the drawings attached.

The present invention pertains to an RC oscillation circuit, particularly, which provides an oscillating signal necessary for a system-on-a-chip in a case where the system-on-a-chip including a wireless telecommunication module is in a sleep mode, which requires low power.

Operation of the present invention will be described with reference to FIGS. 2 to 5.

In a case where the RC oscillating signal fed from the RC oscillation circuit is required, a reference oscillating signal is first generated from a crystal oscillator. The system-on-a-chip including a wireless telecommunication module has a sleep mode to operate with low power. In the sleep mode, the system-on-a-chip performs minimum operation, e.g., operation for receiving a wake-up signal. In this sleep mode, the system-on-a-chip requires a clock signal having a predetermined frequency, particularly, a clock signal with a low frequency to reduce power consumption. Here, the clock signal with a low frequency may be generated from the crystal oscillator providing an accurate oscillating signal. However, the crystal oscillator is hard to be implemented in the system-on-a-chip, and characteristically seldom generates the clock signal having a low frequency. Moreover, the crystal oscillator with a low frequency, when installed in the system-on-a-chip, increases an overall size and adds to costs.

The RC oscillation circuit of the present embodiment includes the RC oscillator using a resistor and a capacitor to provide the low-frequency oscillating signal to the system-on-a-chip.

When the system-on-a-chip adopting the RC oscillation circuit of the present embodiment goes into a sleep mode, the RC oscillation circuit generates and provides an RC oscillating signal. Here, the crystal oscillator 100 generates and provides a reference oscillating signal in operation S110 and the RC oscillator 200 generates and provides the RC oscillating signal.

The crystal oscillator 100 generates the reference oscillating signal from a resonant signal generated from a crystal resonator. The crystal oscillator 100 is relatively less affected by temperature or process, generating and providing a good-quality oscillating signal. Thus, according to the present embodiment, the oscillating signal generated from the crystal oscillator 100 is used as a reference signal for adjusting the RC oscillating signal. The reference oscillating signal is typically a high-frequency signal having a frequency higher than a frequency of the RC oscillating signal. In this specification, the reference oscillating signal is assumed to be a signal having a frequency of 16 Mhz.

Referring to FIG. 2, the reference oscillating signal is generated from the crystal oscillator 100. However, the reference signal may be a reference signal generated from other types of oscillators.

The RC oscillator 200 includes a variable resistor 210 and a variable capacitor 220. The RC oscillator 200 generates the RC oscillating signal having a frequency f determined by a resistance R of the variable resistor 210 and a capacitance C of the variable capacitor 220.

Here, the frequency f is determined according to Equation 1:

$$f = \frac{1}{2\pi RC} \qquad \text{Equation 1}$$

Therefore, the frequency f is determined by the resistance R and the capacitance C. The RC oscillating signal is a low-frequency signal having a frequency lower than the reference oscillating signal fed from the crystal oscillator 100. In the specification, the RC oscillating signal is assumed to be a signal having a frequency of 31.25 kHz.

In a process of manufacturing the system-on-a-chip, the resistance and capacitance have an error of at least 10% with respect to design values, respectively, and accordingly, the frequency f of the RC oscillating signal has an error of about 25%. However, a clock used in a sleep mode of the system-on-a-chip requires accurate timing and thus may have an error of about 0.3%. As a result, the frequency f of the RC oscillating signal needs to be adjusted within an error range.

In the RC oscillation circuit and the oscillation method thereof according to the present embodiment, the frequency f is adjusted by determining the resistance R and the capacitance C.

First, the RC oscillating signal generated from the RC oscillator 200 and the reference oscillating signal generated from the crystal oscillator 100 are fed to the counter 300. The counter 300 counts a clock number of the reference oscillating signal corresponding to one period of the RC oscillating signal to generate a first count value in operation 130.

Here, the first count value is determined by the frequency of the RC oscillating signal and the frequency of the reference frequency signal according to Equation 2:

First count value=Frequency of reference oscillating signal/Frequency of RC oscillating signal/

As described above, when the first count value is generated, the frequency controller 400 derives a difference between the first count value and a preset second count value. The second count value is determined by the frequency of the reference oscillating signal and a target frequency of the RC oscillating signal. As described above, when the frequency of the reference oscillating signal is 16 Mhz and the target frequency of the RC oscillating signal is 31.25 kHz, the second count value is set to 512(=16 Mhz/31.25 kHz) according to Equation 2.

Therefore, comparison between the first count value and the second count value shows how much the frequency of the RC oscillating signal has deviated from the target frequency.

A difference between the first and second count values is compared with a preset third critical value in operation S140. Then when the difference between the first count value and the second count value is greater than a preset third critical value, the frequency controller 400 adjusts a resistance of the variable resistor 210 by a first adjustment value in operation S150. Here, the third critical value is greater than a first critical value and a second critical value, which will be described later. The second critical value is greater than the first critical value.

Therefore, in a case where the difference between the first count value and the second count value is greater than the third critical value, it is considered that the frequency of the RC oscillating signal has deviated considerably from the target frequency. In this case, when the resistance R of the variable resistor 210 and the capacitance C of the variable capacitor 220 are finely adjusted, it requires significant time to adjust the RC oscillating signal to the target frequency.

To reduce such time, in place of finely adjusting the resistance R of the variable resistor 210 and the capacitance C of the variable capacitor 220, only the resistance R of the variable resistor 210 is adjusted by the first adjustment value. Here, the first adjustment value is greater than the second adjustment value, which will be described later.

Meanwhile, in the resistor and the capacitor formed in the system-on-a-chip generally fabricated by a complementary metal oxide semiconductor (CMOS) process, the resistor has an error greater than the capacitor, and accordingly the resistance of the resistor has a greater error range. Therefore, according to the present embodiment, the resistance R is first adjusted to approximate the RC oscillating signal to the target frequency and subsequently the capacitance C is adjusted to approximate the RC oscillating signal to the target frequency more accurately.

The resistance R of the variable resistor 210 is adjusted by the first adjustment value in operation S150 until the difference between the first count value and the second count value is smaller than the third critical value.

When the difference between the first count value and the second count value is smaller than the third critical value, the difference between the first count value and the second count value is compared with the preset second critical value in operation S160. On the other hand, when the difference between the first count value and the second count value is greater than the preset second critical value, the resistance of the variable resistor 210 is adjusted by the second adjustment value smaller than the first adjustment value in operation S170.

Here, the second adjustment value smaller than the first adjustment value allows the RC oscillating signal to be tuned in frequency more precisely than adjusting the resistance of the variable resistor 210 by the first adjustment value in operation S150.

Meanwhile, a method of adjusting the resistance of the variable resistor 210 will be described with reference to FIG. 3 according to an exemplary embodiment of the invention.

Referring to FIG. 3, the variable resistor 210 includes a plurality of resistors 211a to 211d connected in series with one another and a plurality of first switches 212a to 212d connected in parallel with the resistors 211a to 211d, respectively. The frequency controller 400 provides resistance control signals to the first switches 212a to 212d, respectively to control switching operation of the first switches 212a to 212d.

The resistance of the variable resistor 210 is determined according to on/off status of the first switches 212a to 212d.

For example, when the resistors 211a to 211d are assumed to have identical resistances to one another, the resistance of the variable resistor 210 is varied linearly according to the number of the first switches 213a to 212d turned on.

A greater number of the first switches 212a to 212d turned on reduces the resistance of the variable resistor 210. On the other hand, a smaller number of the first switches 212a to 212d turned on increases the resistance of the variable resistor 210. Therefore, when the resistance of the variable resistor 210 is adjusted to by first adjustment value in operation S150, a relatively great number of the first switches 212a to 212d are adjusted to be turned on. Meanwhile, when the resistance of the variable resistor 210 is adjusted by the second adjustment value in operation S170, a smaller number of the first switches 212a to 212d are adjusted to be turned on than in a case where the resistance is adjusted by the first adjustment value.

In consequence, when the RC oscillation frequency deviates relatively considerably from the target frequency, the resistance may be adjusted in a greater range to be approximated to the target frequency fast.

The variable resistor 210 shown in FIG. 3 is exemplary, and may have a resistance determined by a predetermined control signal.

After the frequency of the RC oscillation frequency is approximated to the target frequency by processes of adjusting the resistance as in operations S120 to S170, the frequency of the RC oscillating signal is adjusted more finely. For example, in a case where the frequency of the RC oscillating signal is adjusted by an adjustment value of about 1000 Hz by determining the resistance, the frequency of the RC oscillating signal is adjusted by an adjustment value of about 100 Hz in a next process. Such adjustment of the frequency of the RC oscillating signal is completed by determining the capacitance C which is adjusted more finely than the resistance R.

To this end, as shown in FIG. 5, the difference between the first count value and the second count value is compared with the preset first critical value in operation S180. When the difference between the first count value and the second count value is smaller than the preset third critical value, the capacitance of the variable capacitor 220 is adjusted.

A method of adjusting the capacitance of the variable capacitor 220 will be described with reference to FIG. 4.

Referring to FIG. 4, the variable capacitor 220 includes a plurality of capacitors 221a to 221d connected in parallel with one another and a plurality of second switches 222a to 222d connected in series to the capacitors 212a to 221d, respectively. The frequency controller 400 provides capacitance control signals to the second switches 222a to 222d, respectively to control switching of the second switches 222a to 222d.

The capacitance of the variable capacitor 220 is determined according to on/off status of the second switches 222a to 222d.

For example, when the capacitors 221a to 221d are assumed to have identical capacitances, the capacitance of the variable capacitor 220 is varied linearly according to the number of the second switches 222a to 222d turned on.

Increase in the number of the second switches 222a to 222d turned on reduces the capacitance of the variable capacitor 220. On the other hand, decrease in the number of the second switches 222a to 222d turned on reduces the capacitance of the variable capacitor 220. Therefore, the capacitance can be adjusted finely by controlling on/off of the second switches 222a to 222d.

The variable capacitor 220 shown in FIG. 4 is exemplary, and may have a capacitance determined by a predetermined control signal.

The processes of adjusting the capacitance as in operations S160 to 190 are repeated until the difference between the first count value and the second count value is smaller than the first count value. Also, when the difference between the first count value and the second number is smaller than the first critical value, the frequency of the RC oscillator is substantially identical to the target frequency. This completes controlling of the frequency of the RC oscillating signal.

As described above, the frequency of the RC oscillating signal is controlled by adjusting the resistance and the capacitance. In a case where the frequency of the RC oscillating signal is considerably out of the target frequency, the resistance is adjusted in a greater range. Meanwhile, in a case where the frequency of the RC oscillating signal is approximated to the target frequency, the resistance is adjusted in a smaller range to control the frequency of the RC oscillating signal. This allows the frequency of the RC oscillating signal to be approximated to the target frequency faster. Moreover, to control the frequency of the RC oscillating signal, the capacitance is determined after determining the resistance. This allows the RC oscillating signal to be adjusted to the target frequency more accurately.

As set forth above, according to exemplary embodiments of the invention, a frequency of an RC oscillating signal can be adjusted promptly and accurately despite errors in process or changes in operating environment such as temperature.

In addition, due to no need for a low-frequency crystal oscillator, the RC oscillator can be installed in a system-on-a-chip, thereby reducing size and manufacturing costs of the product.

While the present invention has been shown and described in connection with the exemplary embodiments, it will be apparent to those skilled in the art that modifications and variations can be made without departing from the spirit and scope of the invention as defined by the appended claims.

What is claimed is:

1. A resistor-capacitor oscillation circuit capable of adjusting an oscillating frequency, the resistor-capacitor oscillation circuit comprising:
   a resistor-capacitor oscillator including a variable resistor and a variable capacitor, the resistor-capacitor oscillator generating a resistor-capacitor oscillating signal having a frequency determined by a resistance of the variable resistor and a capacitance of the variable capacitor;
   a counter counting a clock number of a reference oscillating signal corresponding to one period of the resistor-capacitor oscillating signal to generate a first count value, the reference oscillating signal having a preset frequency; and
   a frequency controller controlling the frequency of the resistor-capacitor oscillating signal by determining the resistance of the variable resistor and the capacitance of the variable capacitor such that a difference between the first count value and a preset second count value is smaller than a preset first critical value;
   wherein the frequency controller adjusts the resistance of the variable resistor when the difference between the first count value and the second count value is greater than a preset second critical value, and adjusts the capacitance of the variable capacitor when the difference between the first count value and the second count value is smaller than the second critical value and greater than the first critical value.

2. The resistor-capacitor oscillation circuit of claim 1, wherein the variable resistor comprises:
   a plurality of resistors connected in series with one another; and
   a plurality of first switches connected in parallel with the resistors, respectively,
   wherein the frequency controller controls on/off states of the first switches to determine the resistance of the variable resistor.

3. The resistor-capacitor oscillation circuit of claim 1, wherein the variable capacitor comprises:
   a plurality of capacitors connected in parallel with one another; and
   a plurality of second switches connected in series with the capacitors, respectively,
   wherein the frequency controller controls on/off states of the second switches to determine the capacitance of the variable capacitor.

4. The resistor-capacitor oscillation circuit of claim 1, wherein the frequency controller determines the capacitance of the variable capacitor after determining the resistance of the variable resistor.

5. The resistor-capacitor oscillation circuit of claim 1, wherein the frequency controller adjusts the resistance of the variable resistor by a first adjustment value when the difference between the first count value and the second count value is greater than a preset third critical value, and adjusts the resistance of the variable resistor by a second adjustment value smaller than the first adjustment value when the difference between the first count value and the second count value is smaller than the third critical value and greater than the second critical value.

6. The resistor-capacitor oscillation circuit of claim 1, further comprising a crystal oscillator generating the reference oscillating signal from an oscillating signal generated from a crystal resonator.

7. An oscillation method of a resistor-capacitor oscillation circuit capable of adjusting an oscillation frequency, the oscillation method comprising:
   generating a resistor-capacitor oscillating signal having a frequency determined by a resistance of a variable resistor and a capacitance of a variable capacitor;
   counting a clock number of a reference oscillating signal corresponding to one period of the resistor-capacitor signal to generate a first count value, the reference oscillating signal having a predetermined frequency; and
   adjusting the resistance of the variable resistor and the capacitance of the variable capacitor such that a difference between the first count value and a second count value is smaller than a preset first critical value;
   wherein the adjusting comprises:
   adjusting the resistance of the variable resistor when the difference between the first count value and the second count value is greater than a preset second critical value; and
   adjusting the capacitance of the variable capacitor when the difference between the first count value and the second count value is smaller than the second critical value and greater than the preset first critical value.

8. The oscillation method of claim 7, wherein the resistance of the variable resistor is adjusted by:
   adjusting the resistance of the variable resistor by a first adjustment value when the difference between the first count value and the second count value is greater than a preset third critical value; and
   adjusting the resistance of the variable resistor by a second adjustment value smaller than the first adjustment value when the difference between the first count value and the second count value is smaller than the third critical value and greater than the second critical value.

* * * * *